(12) United States Patent
Kochi et al.

(10) Patent No.: US 6,605,850 B1
(45) Date of Patent: Aug. 12, 2003

(54) SOLID-STATE IMAGE PICKUP DEVICE USING LAYERS HAVING DIFFERENT REFRACTIVE INDICES

(75) Inventors: Tetsunobu Kochi, Hiratsuka (JP); Shigetoshi Sugawa, Atsugi (JP); Isamu Ueno, Hadano (JP); Katsuhisa Ogawa, Machida (JP); Toru Koizumi, Yokohama (JP); Katsuhito Sakurai, Machida (JP); Hiroki Hiyama, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/706,860

(22) Filed: Nov. 7, 2000

Related U.S. Application Data

(62) Division of application No. 09/270,008, filed on Mar. 16, 1999, now Pat. No. 6,188,094.

(30) Foreign Application Priority Data

Mar. 19, 1998 (JP) ............................................ 10-070536

(51) Int. Cl.$^7$ ................................................ H01L 27/14
(52) U.S. Cl. .................. 257/431; 250/206; 250/370.01; 257/225
(58) Field of Search .............................. 250/206, 208.1, 250/370.08, 370.01; 257/233, 414, 428, 429, 431–466, 225; 438/29, 31

(56) References Cited

U.S. PATENT DOCUMENTS

| | | | |
|---|---|---|---|
| 5,118,924 A | 6/1992 | Mehra et al. | |
| 5,306,926 A | 4/1994 | Yonemoto | 257/432 |
| 5,371,397 A | 12/1994 | Maegawa et al. | 257/432 |
| 5,479,049 A | 12/1995 | Aoki et al. | 257/642 |
| 5,644,123 A | * 7/1997 | Hait | 250/216 |
| 5,691,548 A | 11/1997 | Akio | 257/232 |
| 5,693,967 A | 12/1997 | Park et al. | 257/223 |
| 5,739,548 A | 4/1998 | Shigeta et al. | 257/59 |
| 5,796,154 A | 8/1998 | Sano et al. | 257/432 |

FOREIGN PATENT DOCUMENTS

| | | | |
|---|---|---|---|
| EP | 0 757 476 | * | 2/1997 |
| GB | 2 334 817 | * | 9/1999 |
| JP | 9-64325 | | 3/1997 |
| JP | 11-274456 | * | 10/1999 |

* cited by examiner

*Primary Examiner*—Wael Fahmy
*Assistant Examiner*—Marcos D. Pizarro-Crespo
(74) *Attorney, Agent, or Firm*—Fitzpatrick, Cella, Harper & Scinto

(57) ABSTRACT

To achieve a high density, high resolution, or size reduction, there is provided a solid-state image pickup device having a plurality of photoelectric conversion elements formed in a semiconductor substrate, conductive layers formed on the semiconductor substrate between the neighboring photoelectric conversion elements via an interlayer layer, a first interlayer layer formed on the photoelectric conversion elements and conductive layers, a second interlayer layer formed on the first interlayer layer, and microlenses formed above the photoelectric conversion elements, wherein the refraction index of the first interlayer layer located above the photoelectric conversion elements is different from that of the second interlayer layer.

11 Claims, 7 Drawing Sheets

N1<N2, N3 ⎱ LIGHT CAN BE CONDENSED
N3<N4    ⎰ ONTO PHOTODIODE HAVING
N4>N5      SMALLER AREA

N1<N2, N3 ⎱ LIGHT CAN BE CONDENSED
N3<N4    ⎰ ASIDE FROM OBSTACLE
N4<N5      EXISTING BETWEEN LAYERS

1. FORMING PN JUNCTION BY ION IMPLANTATION

2. FORMING SURFACE PASSIVATION LAYER BY CVD
3. FORMING METAL LAYER AS LIGHT SHIELDING LAYER BY SPUTTERING

4. STACKING FIRST AND SECOND INTERLAYER LAYERS BY CVD, FOR EXAMPLE

5. LEVELING SURFACE BY POLISHING (CMP) TO LEAVE SECOND INTERLAYER LAYER OF CONVEX LENS SHAPE IN FIRST INTERLAYER LAYER

SOLID-STATE IMAGE PICKUP DEVICE USING LAYERS HAVING DIFFERENT REFRACTIVE INDICES

This application is a divisional of Ser. No. 09/270,008, filed Mar. 16, 1999, now U.S. Pat. No. 6,188,094.

BACKGROUND OF THE INVENTION

1. Field of the Invention

The present invention relates to a solid-state image pickup device having a photoelectric conversion element for converting light into an electrical signal and a method of manufacturing the same.

2. Related Background Art

In recent years, as solid-state image pickup devices have smaller size, higher density, and higher resolution, a decrease in light-receiving sensitivity due to a decrease in aperture area of a region which is not covered by a light-shielding portion on the light incoming side of a photoelectric conversion element or a decrease in light-receiving area of the photoelectric conversion element poses a problem. To improve sensitivity, a lens that condenses incoming light is provided above the photoelectric conversion element to increase the aperture area of the solid-state image pickup device in effect.

A prior art of a solid-state image pickup device with such microlens will be explained below with reference to FIG. 1 in relation to Japanese Patent No. 2,558,389. Referring to FIG. 1, a photoelectric conversion element 102 is formed on a semiconductor substrate 101, and an insulating layer 103 is formed on the photoelectric conversion element 102 and the remaining surface of the semiconductor substrate 101. A polysilicon transfer electrode portion 104 for transferring photocharges of the photoelectric conversion element 102 is formed on the insulating layer 103 on the remaining surface of the semiconductor substrate 101, and an aluminum light-shielding portion 105 is formed on top of it. A surface passivation layer 106 is formed on the light-shielding portion 105, and a leveling layer 107 that consists of a transparent polymer resin and levels the element surface is formed thereon. Furthermore, a concave microlens layer 108 composed of a transparent polymer resin or materials such as casein, gelatin, and the like is formed, and an inter-lens layer 109 consisting of a transparent polymer resin is formed thereon. A round, convex microlens layer 110 consisting of a transparent polymer resin or casein, gelatin, and the like is formed on the interlayer 109, and a passivation layer 111 consisting of a transparent polymer resin is formed thereon.

With this structure, since the convex microlens layer 110 condenses light, sensitivity can be improved. Also, since the inter-lens layer 109 is interposed between the convex and concave microlens layers 110 and 108, the refraction index of the convex microlens layer 110 and its surface curvature required for focusing light to a size equivalent to that of an aperture portion on the concave microlens layer 108 can be reduced.

Let na, nb, nc, and nd be the refraction indices of the convex microlens layer 110, inter-lens layer 109, concave microlens layer 108, and leveling layer 107, respectively. If na>nb, nc>nb, and nc>nd, i.e., (na, nc)>(nb, nd), light can be condensed most efficiently and can enter the photoelectric conversion element nearly perpendicularly, thereby suppressing production of smear noise, and achieving a high S/N ratio.

Furthermore, since the leveling layer 107 sends light onto the surface of the photoelectric conversion element nearly perpendicularly and therefore the refraction index of the concave microlens and its surface curvature can be reduced, the device can be easily manufactured.

However, a microlens is used to assure an effective aperture ratio despite a small pixel size of the solid-state image pickup device of a photosensor, and the aperture ratio is improved by combining convex and concave lenses. This complicates the layer structure, resulting in high manufacturing cost and low manufacturing yield. Also, a plurality of alignment processes are required, and the effective aperture ratio cannot be desirably improved.

As a recent device has higher density, higher resolution, and smaller size, it is hard to match the optical axis of the microlens placed above the photoelectric conversion element as an underlayering device with the condensed point.

SUMMARY OF THE INVENTION

It is an object of the present invention to provide a solid-state image pickup device which is suitable for higher density, higher resolution, or smaller size, and a method of manufacturing the same.

In order to achieve the above object, according to an aspect of the present invention, there is provided a solid-state image pickup device comprising: a plurality of photoelectric conversion elements formed in a semiconductor substrate; conductive layers formed on the semiconductor substrate between the neighboring photoelectric conversion elements via an interlayer layer; a first interlayer layer formed on the photoelectric conversion elements and conductive layers; a second interlayer layer formed on the first interlayer layer; and microlenses formed above the photoelectric conversion elements, wherein a refraction index of the first interlayer layer located above the photoelectric conversion elements is different from a refraction index of the second interlayer layer.

According to another aspect of the present invention, there is provided a method of manufacturing a solid-state image pickup device, comprising the steps of: forming a plurality of photoelectric conversion elements in a semiconductor substrate; forming light-shielding layers or signal wire for outputting signals from the photoelectric conversion elements on the semiconductor substrate between the neighboring photoelectric conversion elements via an interlayer layer; forming a first interlayer layer on the photoelectric conversion elements and the light-shielding layer or signal wire; forming a second interlayer layer on the first interlayer layer; and forming microlenses above the photoelectric conversion elements, wherein the microlenses forming step including steps of forming the first interlayer layer by CVD, forming the second interlayer layer having a refraction index different from a refraction index of the first interlayer layer on a surface of the first interlayer layer by CVD, leveling a surface of the second interlayer layer by polishing by CMP, coating a microlens material resin onto the leveled surface, softening the material by heating, and hardening the material.

Furthermore, according to the present invention, there is provided a solid-state image pickup device comprising: a plurality of photoelectric conversion elements formed in a semiconductor substrate; an interlayer layer formed above the photoelectric conversion elements; and light-shielding means for shielding light, wherein the interlayer layer is formed with a step using a step of the light-shielding means.

According to still another aspect of the present invention, there is provided a method of manufacturing a solid-state image pickup device, comprising the steps of: forming a plurality of photoelectric conversion elements in a semiconductor substrate; forming an interlayer layer above the photoelectric conversion elements; and forming light-shielding means on a flat surface above the photoelectric conversion elements, wherein the interlayer layer is formed on a surface including at least the light-shielding means.

Other objects and features of the present invention will become apparent from the following description taken in conjunction with the accompanying drawings.

DESCRIPTION OF THE PREFERRED EMBODIMENTS

Figure 1:
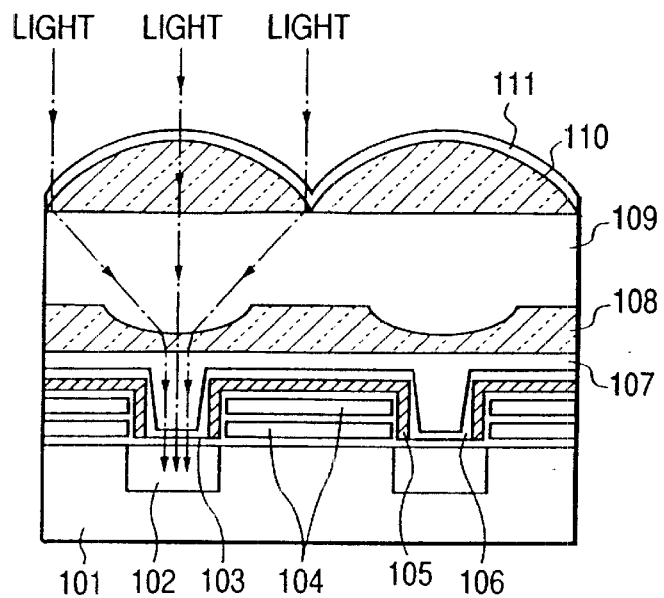
FIG. 1 is a sectional view showing a conventional solid-state image pickup device.
Figure 2:
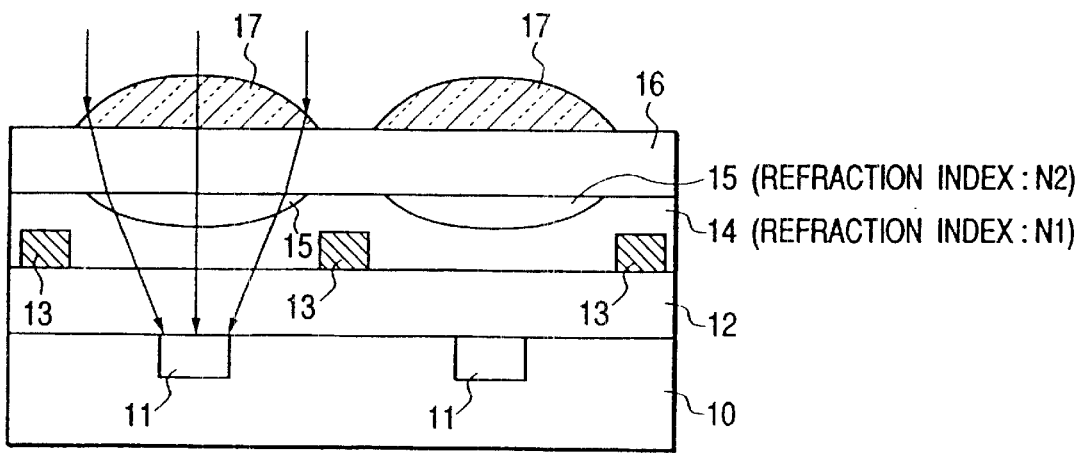
FIG. 2 is a schematic sectional view showing the first embodiment of the present invention.

FIG. 2 is a schematic sectional view showing the first embodiment of the present invention. A solid-state image pickup device shown in FIG. 2 has a p- or n-type semiconductor substrate 10, and photoelectric conversion elements 11 formed in the semiconductor substrate 10. Each photoelectric conversion element 11 is a region of a conductivity type opposite to that of the substrate 10, and forms a PN diode with the substrate 10. A surface passivation layer 12 is formed on the photoelectric conversion elements 11 and the remaining surface of the semiconductor substrate 10. Conductive layers 13 are formed on the surface passivation layer on the remaining surface of the semiconductor substrate 10 and, for example, transfer photocharges of the photoelectric conversion elements 11. A first interlayer layer 14 is formed on the conductive layers 13 and the surface passivation layer 12. A second interlayer layer 15 forms a concave lens on the first interlayer layer 14. A resin layer 16 consists of a transparent polymer resin. Convex microlenses 17 are formed on the resin layer 16 at positions above the photoelectric conversion elements 11. In this structure, the respective layers formed above the photoelectric conversion elements 11 are transparent. Light coming from above is condensed to excite electrons and holes in the photoelectric conversion elements 11, and is output to an external circuit as an image signal via the conductive layers 13.

Figure 3A:
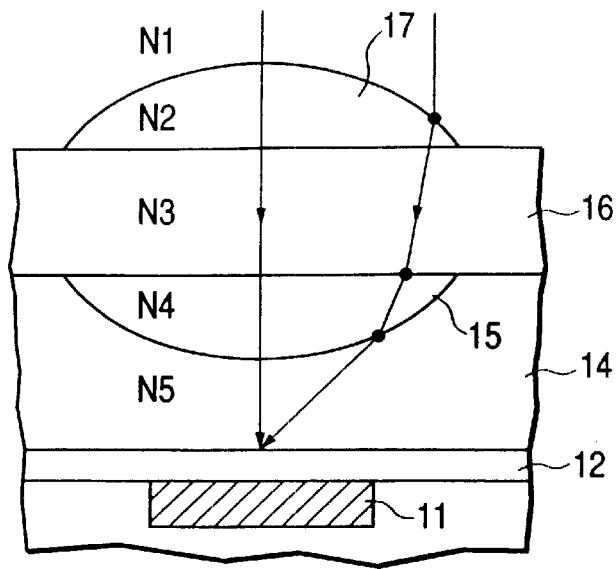
FIGS. 3A and 3B are sectional views showing relationships among the refraction indices of the respective layers in the embodiment of the present invention.
Figure 3B:
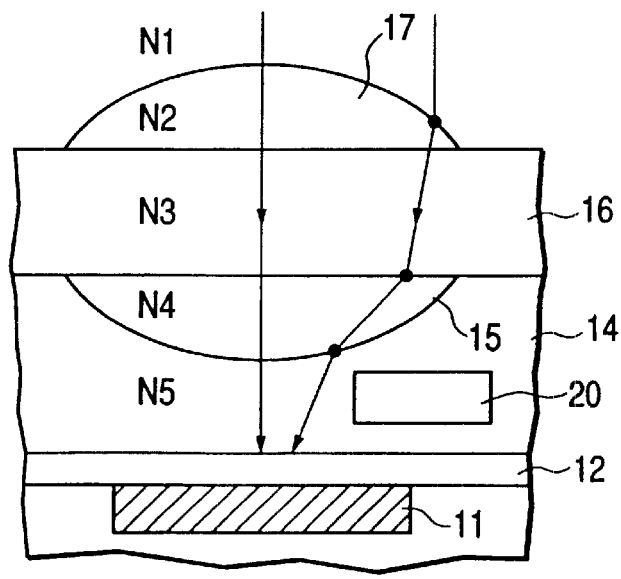

FIGS. 3A and 3B show examples of the refraction indices of the respective layers of the solid-state image pickup device. In FIG. 3A, let N1 be the refraction index of air, N2 be that of the convex microlens 17, N3 be that of the resin layer 16, N4 be that of the second interlayer layer 15, and N5 be that of the first interlayer layer 14. Then, if these refraction indices are set to satisfy:

N1<N2, N3

N3<N4

N5<N4 light can be condensed on the photoelectric conversion element 11 as a photodiode with a small area, as indicated by a light beam curve in FIG. 3A. Note that the above conditions are satisfied when the first interlayer layer consists of TEOS (Tetra-Ethyl-Ortho-Silicate)-$SiO_2$, and the second interlayer layer consists of SiOF. In such case, upon formation of layers, the initial polishing speed by CMP can be improved, and high-speed processes are attained.

On the other hand, if the refraction indices of the solid-state image pickup device with the arrangement shown in FIG. 3B are set to satisfy:

N1<N2, N3

N3<N4

N4<N5 light can be condensed on the photoelectric conversion element 11 aside from an obstacle 20 (e.g., the conductive layer 13) present in the first interlayer layer 14. Note that the above conditions are satisfied when the first interlayer layer is composed of SiOF, and the second interlayer layer is composed of TEOS (Tetra-Ethyl-Ortho-Silicate)-$SiO_2$. By stacking an SiOF interlayer layer material having a refraction index lower than that of $SiO_2$, a more efficient microlens can be formed.

Furthermore, in FIGS. 3A and 3B, both the first and second interlayer layers may be formed of TEOS (Tetra-Ethyl-Ortho-Silicate)-$SiO_2$ and have different densities.

The above embodiment has explained a solid-state image pickup device having first and second interlayer layers and microlens. However, the present invention is not limited to such specific device, but may be applied to a solid-state image pickup device that condenses light by a structure with a first interlayer layer alone.

The second embodiment of the present invention will be described below with reference to FIGS. 4A, 4B, 4C, and 4D. A solid-state image pickup device of this embodiment is manufactured by the following method.

Figure 4A:
FIGS. 4A, 4B, 4C, and 4D are sectional views showing the manufacturing steps according to the second embodiment of the present invention.

Referring to FIG. 4A, a resist mask is formed on a semiconductor substrate 10 except for prospective formation regions of photoelectric conversion elements, and a Group III element such as boron in case of an n-type semiconductor substrate 10 or a Group V element such as phosphorus in case of a p-type semiconductor substrate 10 is ion-implanted to form photoelectric conversion elements 11. Upon ion implantation, an impurity such as silicon, phosphorus, boron, or the like is ionized, and is implanted into a wafer of the semiconductor substrate by applying an appropriate acceleration voltage. After implantation, the wafer is annealed at high temperature to electrically activate the impurity.

Figure 4B:
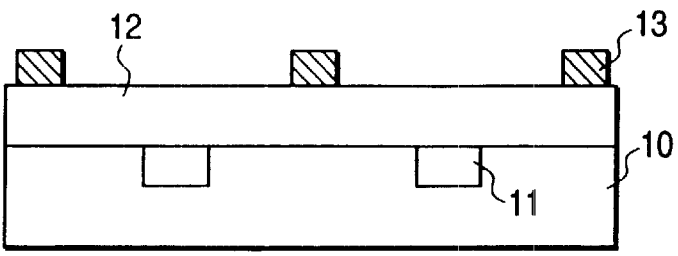

As shown in FIG. 4B, the resist mask is removed, and a surface passivation layer 12 as an insulating member is formed on the photoelectric conversion elements 11 and the remaining surface of the semiconductor substrate 10 by LP (Low pressure) CVD, and conductive layers 13 consisting of a metal such as Al or the like and serving as light-shielding layers are formed by sputtering or the like. A plurality of conductive layers 13 may be formed via the surface passivation films 12.

Figure 4C:
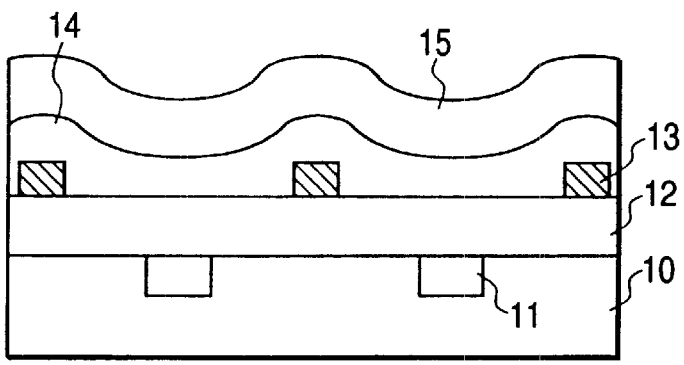

As shown in FIG. 4C, a first interlayer layer 14 having roughly a uniform thickness is formed on the entire surface by TEOS-CVD. In this case, the first interlayer layer 14 is also formed on the conductive layers 13 on the surface passivation layer 12 to have a uniform thickness, thus providing a concave surface corresponding the heights of the conductive layers 13, which are formed at a predetermined spacing.

Furthermore, a second interlayer layer 15 having a refraction index different from that of the first interlayer layer 14 is stacked on the first interlayer layer 14. In this case, since a second interlayer layer 15 having a uniform thickness is formed on the entire surface, a concave surface is formed in correspondence with the heights of the conductive layers 13, which are formed at a predetermined spacing. In this case, when a dense TEOS (Tetra-Ethyl-Ortho-Silicate)-$SiO_2$ layer is formed as the first interlayer layer 14, and a coarse TEOS (Tetra-Ethyl-Ortho-Silicate)-$SiO_2$ layer is formed as the second interlayer layer 15, the polishing speed by the next CMP can be improved.

Figure 4D:
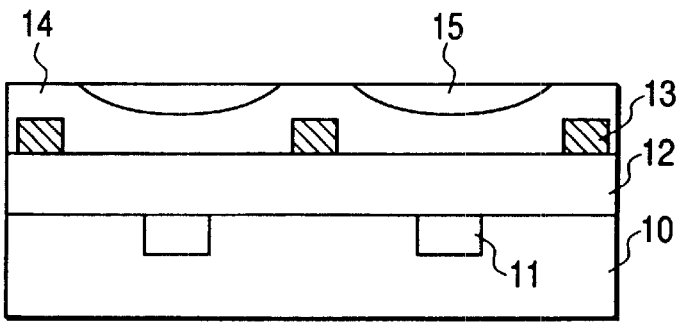

Moreover, as shown in FIG. 4D, after the second interlayer layer 15 is formed, the upper surface is leveled by polishing the entire surface by CMP (Chemical Mechanical Polishing), and the second interlayer layer 15 is polished until downward convex lenses are formed.

After that, as shown in FIG. 2, a transparent polymer resin layer 16 is formed, and convex microlenses 17 are formed. The transparent polymer resin layer 16 may or may not be formed. Also, a color-filter layer may be formed under the microlenses 17. Furthermore, a transparent resin layer having a low refraction index may be formed on the convex microlenses 17 so as to level and protect the surface.

With this manufacturing method of the solid-state image pickup device, the manufacturing process can be simplified, thus improving the manufacturing yield. In addition, since microlenses can be accurately formed above the photoelectric conversion elements, alignment precision of the microlenses can be improved.

In this solid-state image pickup device, the downward convex microlenses 15 are formed at positions above the photoelectric conversion elements 11 that form an area sensor and between the neighboring conductive layers 13. Hence, the spacings and heights of the conductive layers 13 are important parameters upon forming the downward convex microlenses 15.

Figure 5:
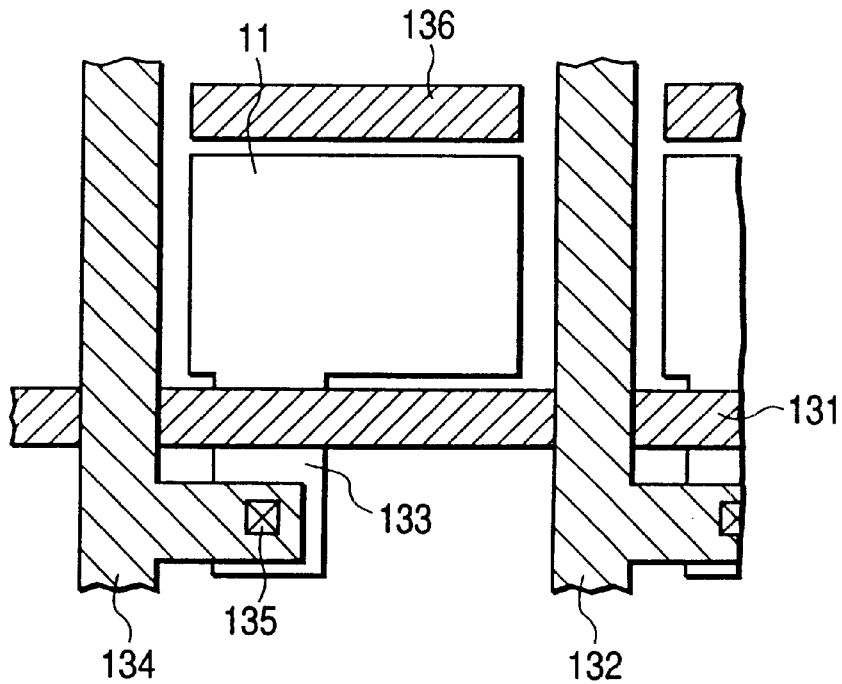
FIG. 5 is a plan view of a solid-state image pickup device according to the embodiment of the present invention.

FIG. 5 is a plan view showing the photoelectric conversion element and its peripheral circuits. FIG. 5 illustrates the photoelectric conversion element 11 as a photodiode, one vertical select line 131 of the conductive layers 13, an output signal line 132, a transfer transistor 133, an output signal line 134 in the neighborhood of the output signal line 132, a through hole 135 connected to the source/drain of the transfer transistor 133, and a dummy conductive layer 136. In this structure, the downward convex microlenses 15 shown in FIG. 4D are formed on low-level photodiode portions bounded by the output signal lines 132 and 134, vertical select line 131, and dummy conductive layer 136. The dummy conductive layer 136 is provided to form a step upon forming the convex microlenses 15. If no dummy conductive layer 136 is formed, no conductive layer 13 is formed until the next vertical select line, and the convex microlens 15 cannot be formed.

In place of the dummy conductive layer 136, a power supply interconnect for the photoelectric conversion element may be formed since the power supply interconnect preferably has constant potential compared to a conductive layer in a floating state.

In this way, the four sides that bound the convex microlens 15 are the conductive layers 13 formed on the surface passivation layer 12 shown in FIG. 4B, and the vertical select line 131 is formed on the output signal lines 132 and 134 to sandwich the surface passivation layer 12 therebetween.

Figure 6:
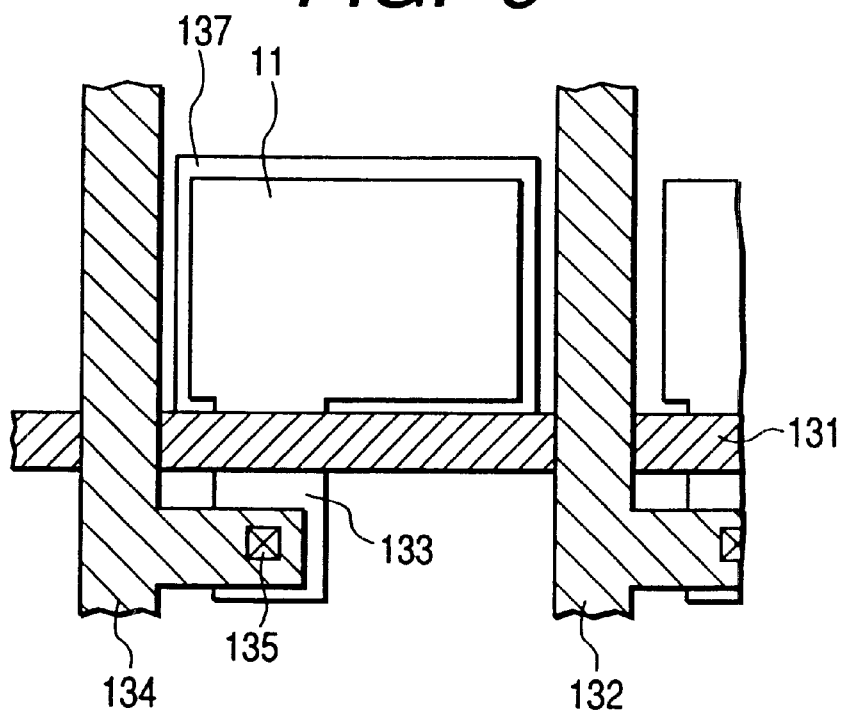
FIG. 6 is a plan view of the solid-state image pickup device according to the embodiment of the present invention.

FIG. 6 is a plan view showing another example of the photoelectric conversion element 11 and its peripheral circuits. Unlike FIG. 5, a light-shielding aperture portion 137 consisting of a metal such as Al or the like is formed around the photoelectric conversion element 11 as a photodiode. The light-shielding aperture portion 137 is obtained by forming the light-shielding layer 13 shown in FIG. 4B on the surface passivation layer 12 to have a step, so that it has a height equal to or larger than those of the vertical select line 131 and the output signal lines 132 and 134 as conductive layers around the photoelectric conversion element 11. Alternatively, the light-shielding aperture portion 137 may be formed to cover the vertical signal line 131 and output signal lines 132 and 134 to intercept light that becomes incident on a portion other than the photoelectric conversion element 11. In this case, the shape of the downward convex microlens 15 above the photoelectric conversion element 11 can be clearly distinguished, and the microlens 15 can be formed without any variations in area and height, thus improving the characteristics of the microlens.

Figure 7:
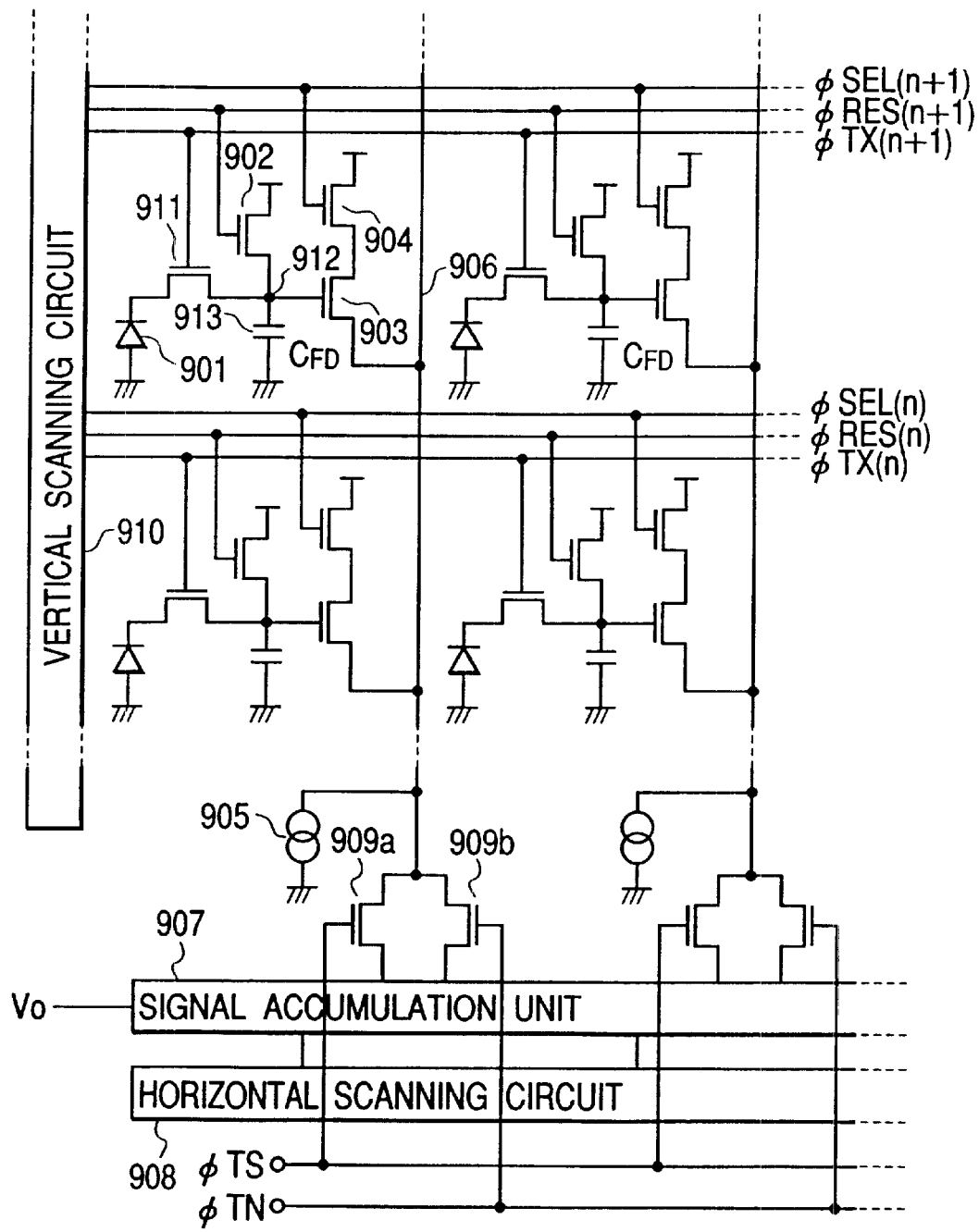
FIG. 7 is a circuit diagram of the solid-state image pickup device according to the embodiment of the present invention.

FIG. 7 is a circuit diagram of a solid-state image pickup device with a microlens. FIG. 7 shows the arrangement of a two-dimensional sensor having 2×2 pixels, but the number of pixels is not limited to four.

The pixel portion circuit of a CMOS area sensor shown in FIG. 7 will be explained. In each pixel, a photodiode 901, transfer switch 911, reset switch 902, pixel amplifier 903, and row select switch 904 are formed. The gate of the transfer switch 911 is connected to φTX(n or n+1) from a vertical scanning circuit 910, the gate of the reset switch 902 is connected to φRES(n or n+1) from the vertical scanning circuit 910, and the gate of the row select switch 904 is connected to φSEL(n or n+1) from the vertical scanning circuit 910.

Photoelectric conversion is done by the photodiode 901. During the accumulation period of a light amount charge, the transfer switch 911 is kept OFF, and no charge photoelectrically converted by the photodiode 901 is transferred to the gate of a source-follower 903 that constructs the pixel amplifier. The gate of the source-follower 903 that constructs the pixel amplifier is reset to an appropriate voltage since the reset switch 902 is turned on before the beginning of accumulation. That is, this reset level corresponds to dark level. Subsequently or simultaneously, when the row select switch 904 is turned on, the source-follower constituted by a load current source 905 and the pixel amplifier 903 is operative, and when the transfer switch 911 is turned on that timing, the charge accumulated on the photodiode 901 is transferred to the gate of the source-follower constructed by the pixel amplifier.

At that time, the output of the selected row is generated on a vertical output line 906. This output is accumulated in a signal accumulation unit 907 via transfer gates 909a and 909b. The output temporarily stored in the signal accumulation unit 907 is sequentially read out to an output unit V0 by a horizontal scanning circuit 908.

Figure 8:
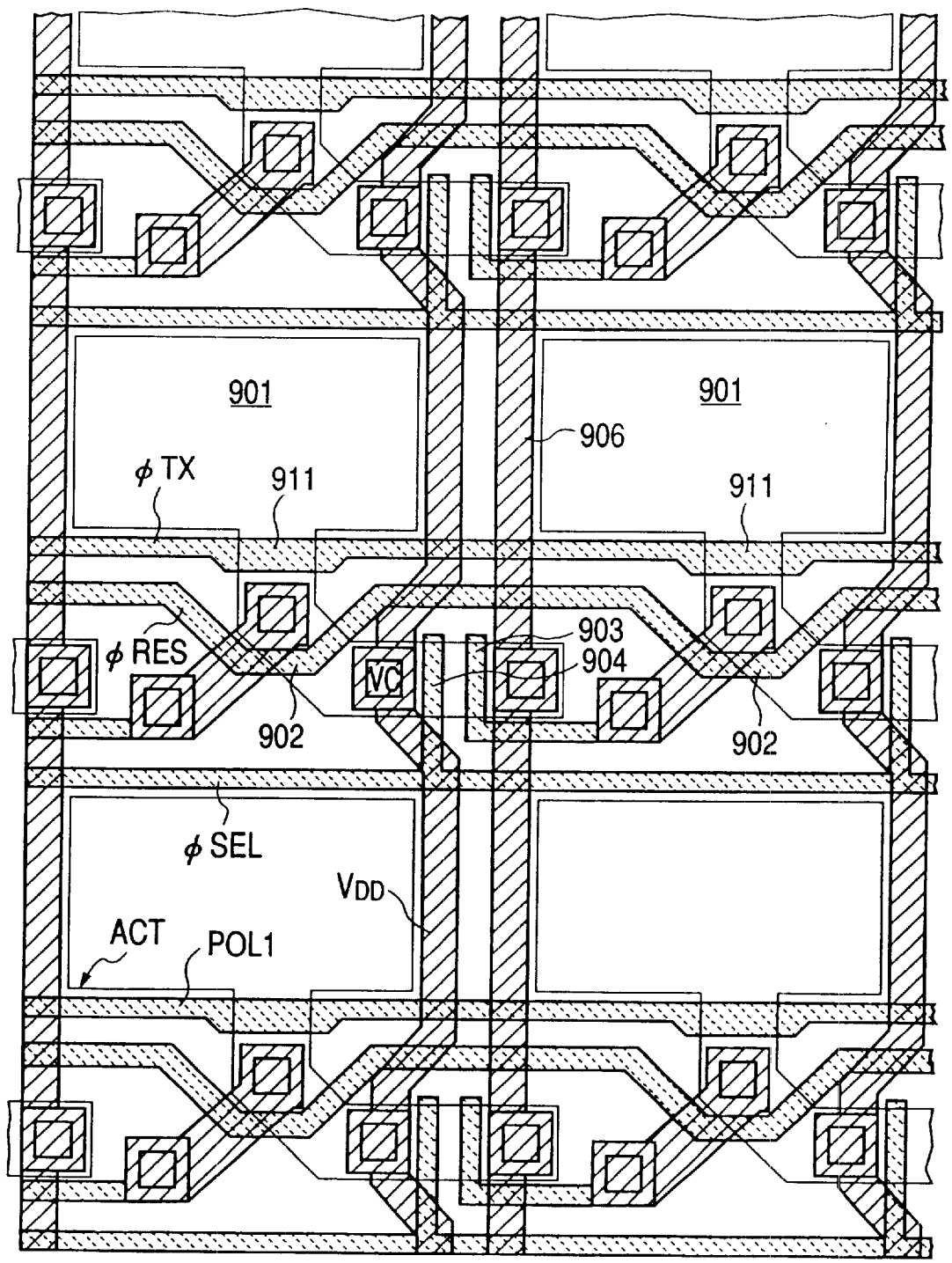
FIG. 8 is a circuit diagram of the solid-state image pickup device according to the embodiment of the present invention.

FIG. 8 is a plan view of the photoelectric conversion element corresponding to FIG. 7. The same reference numerals in FIG. 8 denote the same parts as those in FIG. 7. Referring to FIG. 8, each photoelectric conversion element is composed of the photodiode 901, transfer switch 911, source-follower 903, its gate, and the like, and the photodiode 901 is bounded by select lines φSEL(n or n+1) and φTX(n or n+1), the vertical output line 906, and a power supply line $V_{DD}$.

Figure 9:
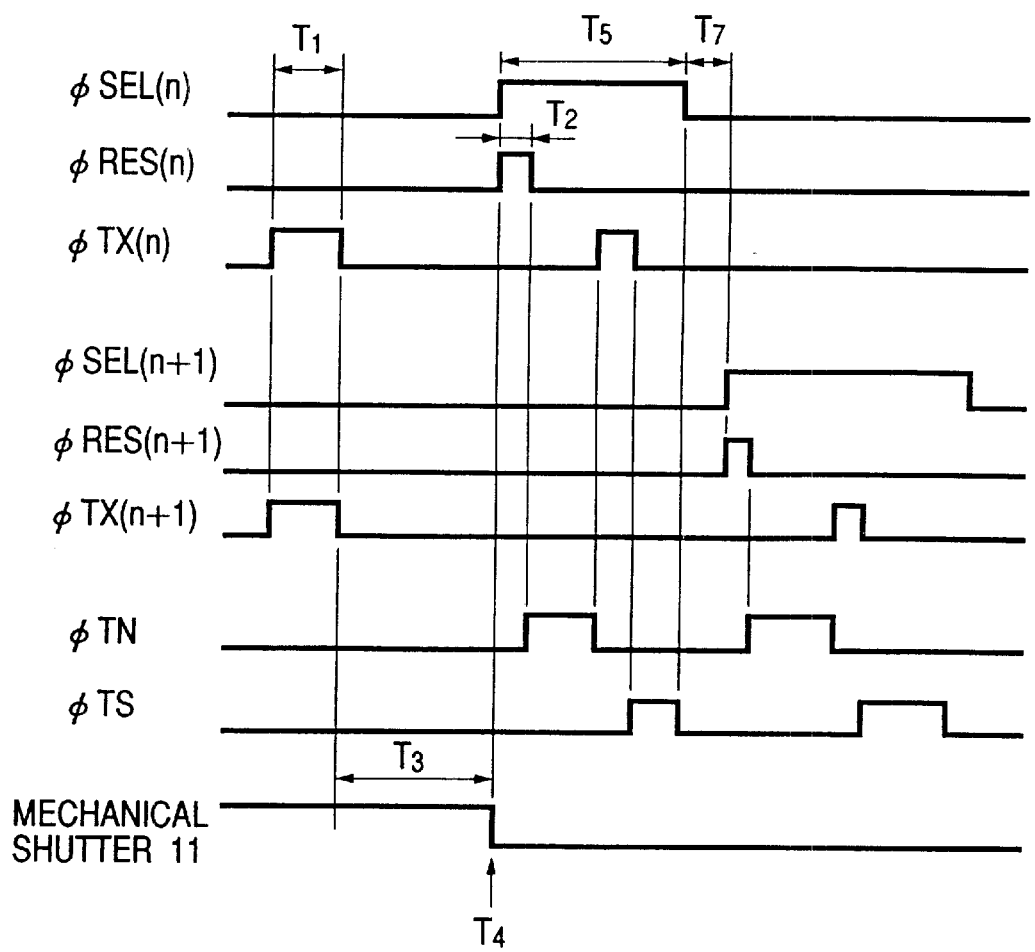
FIG. 9 is a timing chart of the solid-state image pickup device according to the embodiment of the present invention.

FIG. 9 is a timing chart showing the operation of the CMOS area sensor shown in FIG. 7. At the timing of an all-pixel reset period T1, φTX(n) and φT(n+1) are activated, and the charges on the photodiodes 901 of all pixels are transferred to the gates of the corresponding source-follower 903 via the transfer switches 911, thus resetting the photodiodes 901. In this state, the cathode charges of the photodiodes 901 are transferred to those of the source-followers 903 and are averaged. By increasing the capacitor $C_{FD}$ 913 component of the gate of the source-follower 903, the average level becomes equal to the reset level of the cathode of the photodiode 901.

At this time, a mechanical shutter 11 (not shown) that guides an optical image to be sensed is open, and all the pixels begin to accumulate charges simultaneously with the end of the period T1. The mechanical shutter 11 is kept open during a period T3, which corresponds to the accumulation period of the photodiodes 901.

After an elapse of the period T3, the mechanical shutter is closed at timing T4, thus ending photocharge accumulation of the photodiodes 901. In this state, the photodiodes 901 accumulate charges. Then, a read is started in units of lines. More specifically, the (N−1)-th row is read out, and then the N-th row is read out.

During a period T5, φSEL(n) is activated to turn on the row select switch 904, so that the source-follower circuits constructed by the pixel amplifiers 903 in all pixels connected to the n-th row are rendered operative. The gate of the source-follower constructed by the pixel amplifier 903 is reset since φRES(n) is activated during a period T2 to turn on the reset switch 902. More specifically, this dark-level signal is output onto the vertical output line 906.

Then, φTN(n) is activated to turn on the transfer gate 909b, thus holding charges in the signal accumulation unit 907. This operation is parallelly executed for all pixels connected to the N-th row. Upon completion of transfer of the dark-level signal to the signal accumulation unit 907, signal charges accumulated on the photodiodes 901 are transferred to the gates of the source-followers comprised of the pixel amplifiers 903 by turning on the transfer switches 911 by activating φTX(n). At this time, the potential of the gate of each source-follower constructed by the pixel amplifier 903 varies from reset level by an amount corresponding to the transferred signal charge, thus determining the signal level.

At this time, φTS is activated to turn on the transfer gate 909a, thus holding the signal levels in the signal accumulation unit 907. This operation is parallelly executed for all pixels connected to the N-th row. The signal accumulation unit 907 holds dark levels and signal levels of all pixels connected to the N-th row, and the difference between the dark and signal levels is calculated in units of pixels to cancel fixed pattern noise (FPN) due to variations of threshold voltages Vth of the source-followers and KTC noise produced upon resetting of the reset switches 902, thereby obtaining high S/N signals from which noise components have been removed.

These difference signals between the dark and signal levels accumulated in the signal accumulation unit 907 are horizontally scanned by the horizontal scanning circuit 908, thereby time-serially outputting the signals at timing T7. In this way, the output of the N-th row is complete. Similarly, φSEL(n+1), φRES(n+1), φTX(n+1), φTN, and φTS are driven in the same manner as the N-th row, as shown in FIG. 9, thus reading out signals of the (N+1)-th row.

In the prior art, since the difference between the dark and signal levels is output, a high S/N ratio can be achieved, and a high-quality image signal can be obtained. Since the solid-state image pickup element of this embodiment can be realized by a CMOS compatible process, and can be formed on one chip together with peripheral circuits, low cost and multiple functions can be realized. Furthermore, as downward convex microlens aligned by the output signal line 906, the reset line φRES as a vertical select line, and the like, can be formed above the photodiode 901, photodetection sensitivity can be greatly improved.

To restate, according to the first to third embodiments, since conductive layers are formed around the photoelectric conversion element, and the first and second interlayer layers are formed and leveled by CMP, a solid-state image pickup device having a function of condensing light on the photoelectric conversion element can be formed by a simple manufacturing method, i.e., by forming downward convex microlens in correspondence with the upper convex microlens.

A reduction of manufacturing cost leads to high yield. Especially, when microlenses are manufactured by bounding the photoelectric conversion elements using a light-shielding layer, a plurality of microlenses can be accurately aligned and formed, thus providing a high-precision, high-density, high-sensitivity solid-state image pickup device suffering less variations.

Furthermore, since a recent device has higher density, higher resolution, and smaller size, if the microlens can be self-aligned to the photoelectric conversion element as an underlayering device, the optical axis can be set to agree with the condensed point, thus improving photoelectric conversion efficiency.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state image pickup apparatus comprising:

a plurality of pixels, each pixel comprising a photoelectric conversion element including a first area of a first conductivity type and a second area which is formed in the first area and has a second conductivity type opposite to the first conductivity type, and a reset transistor for performing reset operation;

an output line for outputting a signal from said each pixel;

a reset signal line for supplying a predetermined signal to a control electrode of said each reset transistor; and a concave upper surface portion positioned over said each second area;

wherein said concave upper surface portion is positioned on steps of at least intersecting two of said output line, a power supply line, a select line and said reset signal line, and wherein no leveling layer exists in an area which is located in a vertical direction between said concave upper surface portion and said output line, said power supply line, said select line and said reset signal line.

2. An apparatus according to claim 1, further comprising a fourth area which is formed on the concave upper surface portion, wherein a refraction of a third area having concave upper surface portion is different from that of said fourth area.

3. An apparatus according to claim 2, wherein said third area is formed of Tetra-Ethyl-Ortho-Silicate (TEOS)-$SiO_2$ and said fourth area is formed of SiOF.

4. An apparatus according to claim 2, wherein said third area is formed of SiOF and said fourth area is of Tetra-Ethyl-Ortho-Silicate (TEOS)-$SiO_2$.

5. An apparatus according to claim 2, wherein each of said third area and fourth area is formed of Tetra-Ethyl-Ortho-Silicate (TEOS)-$SiO_2$ and densities of the TEOS-$SiO_2$ of said third and fourth areas are different from each other.

6. A solid-state image pickup apparatus comprising:

a plurality of pixels, each pixel comprising a photoelectric conversion element including a first area of a first conductivity type and a second area which is formed in the first area and has a second conductivity type opposite to the first conductivity type, an amplifier transistor for amplifying and outputting a signal output from said photoelectric conversion element, and a reset transistor for resetting a control electrode of the amplifier transistor;

an output line for outputting a signal from said each pixel;

a reset signal line for supplying a predetermined signal to a control electrode of said each reset transistor; and a concave upper surface portion positioned over said each second area;

wherein said concave upper surface portion is positioned on steps of at least intersecting two of said output line, a power supply line, a select line and said reset signal line, and wherein no leveling layer exists in an area which is located in a vertical direction between said concave upper surface portion and said output line, said power supply line, said select line and said reset signal line.

7. An apparatus according to claim 6, further comprising a fourth area which is formed on the concave upper surface portion, wherein a refraction of a third area having concave upper surface portion is different from that of said fourth area.

8. An apparatus according to claim 7, wherein said third area is formed of Tetra-Ethyl-Ortho-Silicate (TEOS)-$SiO_2$ and said fourth area is formed of SiOF.

9. An apparatus according to claim 7, wherein said third area is formed of SiOF and said fourth area is of Tetra-Ethyl-Ortho-Silicate (TEOS)-$SiO_2$.

10. An apparatus according to claim 7, wherein each of said third area and fourth area is formed of Tetra-Ethyl-Ortho-Silicate (TEOS)-$SiO_2$ and densities of the TEOS-$SiO_2$ of said third and fourth areas are different from each other.

11. A driving method for the solid-state image pickup apparatus defined in any one of claims 1 and 6, comprising:

a first driving step of resetting said each pixel and reading out a signal from said each pixel immediately after reset of said each pixel; and a second step of reading out a signal generated by photoelectric conversion of the light condensed by said concave upper surface portion, from said each pixel through said output line.

\* \* \* \* \*